US012154987B2

(12) United States Patent
Nandakumar et al.

(10) Patent No.: US 12,154,987 B2
(45) Date of Patent: *Nov. 26, 2024

(54) DAMAGE IMPLANTATION OF CAP LAYER

(71) Applicant: Texas Instruments Incorporated, Dallas, TX (US)

(72) Inventors: Mahalingam Nandakumar, Richardson, TX (US); Wayne Bather, Richardson, TX (US); Narendra Singh Mehta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

This patent is subject to a terminal disclaimer.

(21) Appl. No.: 17/548,827

(22) Filed: Dec. 13, 2021

(65) Prior Publication Data

US 2022/0102553 A1    Mar. 31, 2022

Related U.S. Application Data

(60) Continuation of application No. 15/674,266, filed on Aug. 10, 2017, now abandoned, which is a division of application No. 12/817,829, filed on Jun. 17, 2010, now abandoned, which is a division of application No. 11/771,269, filed on Jun. 29, 2007, now Pat. No. 8,859,377.

(51) Int. Cl.
*H01L 29/78* (2006.01)
*H01L 21/8238* (2006.01)
*H01L 29/66* (2006.01)
*H01L 21/3115* (2006.01)

(52) U.S. Cl.
CPC .. *H01L 29/7847* (2013.01); *H01L 21/823807* (2013.01); *H01L 29/6659* (2013.01); *H01L 21/31155* (2013.01); *H01L 21/8238* (2013.01); *H01L 21/823814* (2013.01)

(58) Field of Classification Search
CPC .......... H01L 21/31155; H01L 21/8238; H01L 21/823807; H01L 21/823814; H01L 29/6659; H01L 29/7847
See application file for complete search history.

(56) References Cited

U.S. PATENT DOCUMENTS

| 6,103,599 A | 8/2000 | Henley et al. |
| 6,429,084 B1 | 8/2002 | Park |
| 6,803,289 B1 | 10/2004 | Gopalan |
| 2001/0055845 A1 | 12/2001 | Arai et al. |
| 2002/0016042 A1 | 2/2002 | Xia et al. |

(Continued)

FOREIGN PATENT DOCUMENTS

KR    20020036555 A    5/2002

OTHER PUBLICATIONS

Machine Translation of KR2002-0036555; 2019; 15 pages.

*Primary Examiner* — Andres Munoz
(74) *Attorney, Agent, or Firm* — Yudong Kim; Frank D. Cimino

(57) ABSTRACT

A method for fabricating a transistor on a semiconductor wafer includes providing a partial transistor containing a gate stack, extension regions, and source/drain sidewalls. The method also includes performing a source/drain implant of the semiconductor wafer, forming a cap layer over the semiconductor wafer, and performing a source/drain anneal. In addition, the method includes performing a damage implant of the cap layer and removing the cap layer over the semiconductor wafer.

23 Claims, 9 Drawing Sheets

(56) References Cited

U.S. PATENT DOCUMENTS

| | | |
|---|---|---|
| 2004/0023478 A1 | 2/2004 | Samavedam et al. |
| 2004/0043574 A1 | 3/2004 | Steiner et al. |
| 2004/0245583 A1 | 12/2004 | Horiuchi et al. |
| 2005/0032321 A1 | 2/2005 | Huang et al. |
| 2005/0104095 A1 | 5/2005 | Ng et al. |
| 2005/0118770 A1 | 6/2005 | Nandakumar et al. |
| 2005/0156237 A1 | 7/2005 | Grudowski |
| 2005/0202657 A1 | 9/2005 | Borland et al. |
| 2006/0246672 A1 | 11/2006 | Chen et al. |
| 2006/0267106 A1 | 11/2006 | Chao |
| 2007/0023822 A1 | 2/2007 | Sung et al. |
| 2007/0122987 A1 | 5/2007 | Hsiao et al. |
| 2008/0003734 A1 | 1/2008 | Chuang et al. |
| 2008/0085607 A1 | 4/2008 | Yu et al. |
| 2008/0160786 A1 | 7/2008 | Chen et al. |
| 2008/0206943 A1 | 8/2008 | Chen et al. |
| 2008/0242020 A1 | 10/2008 | Chen et al. |

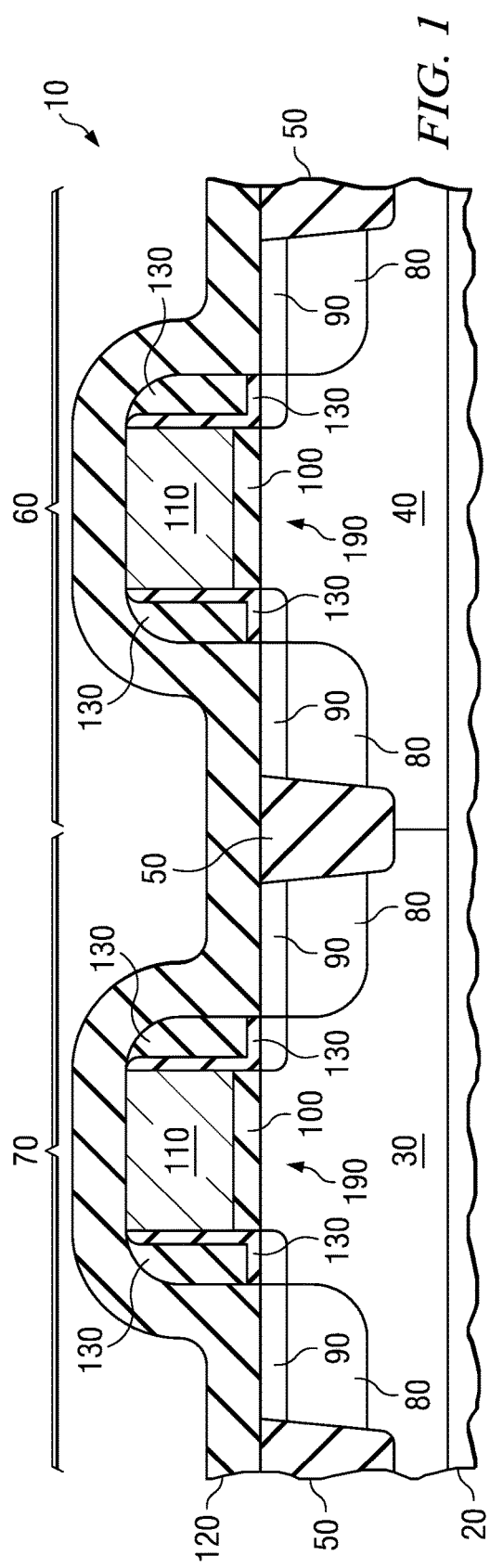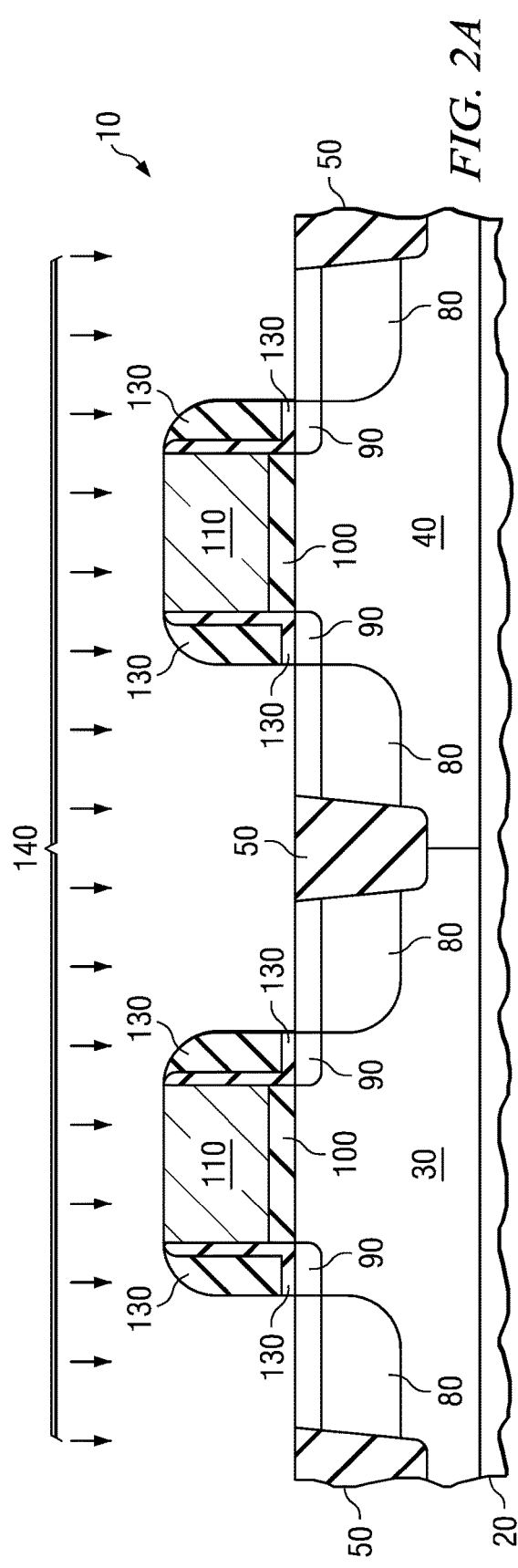

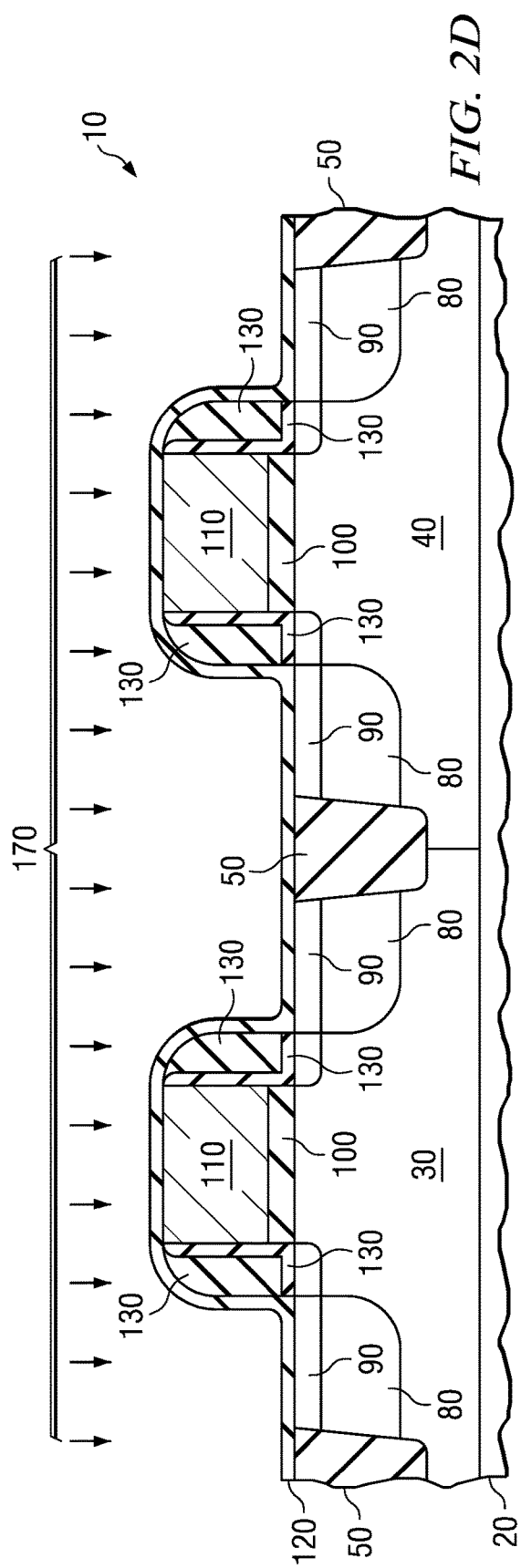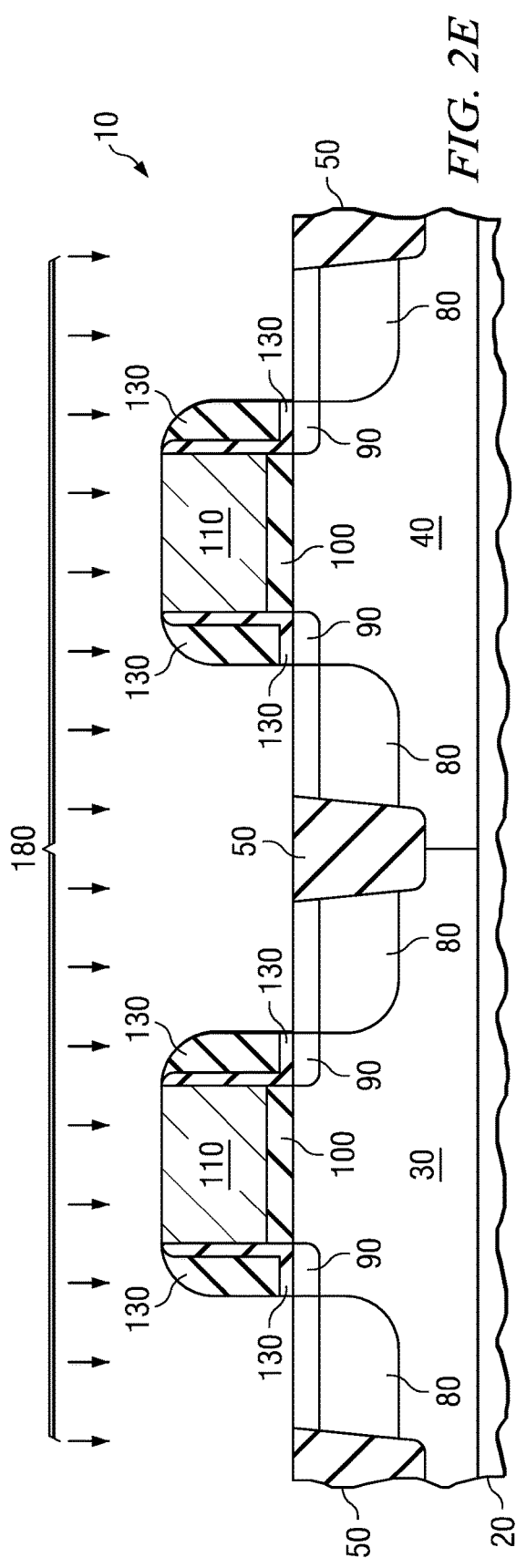

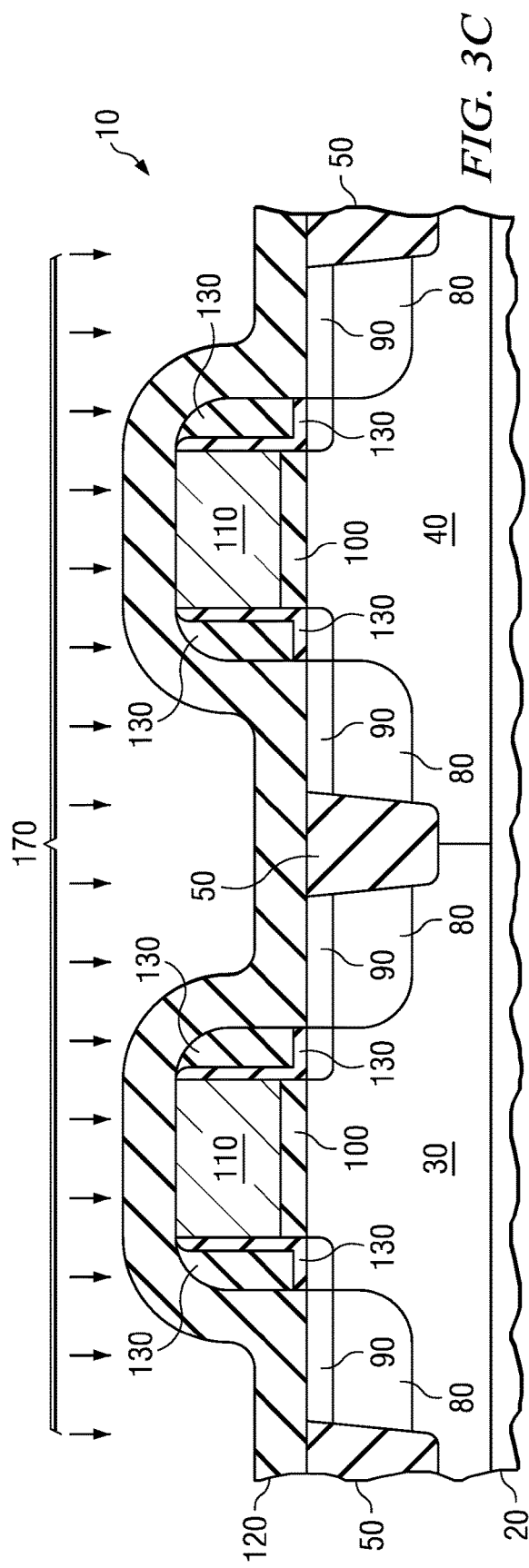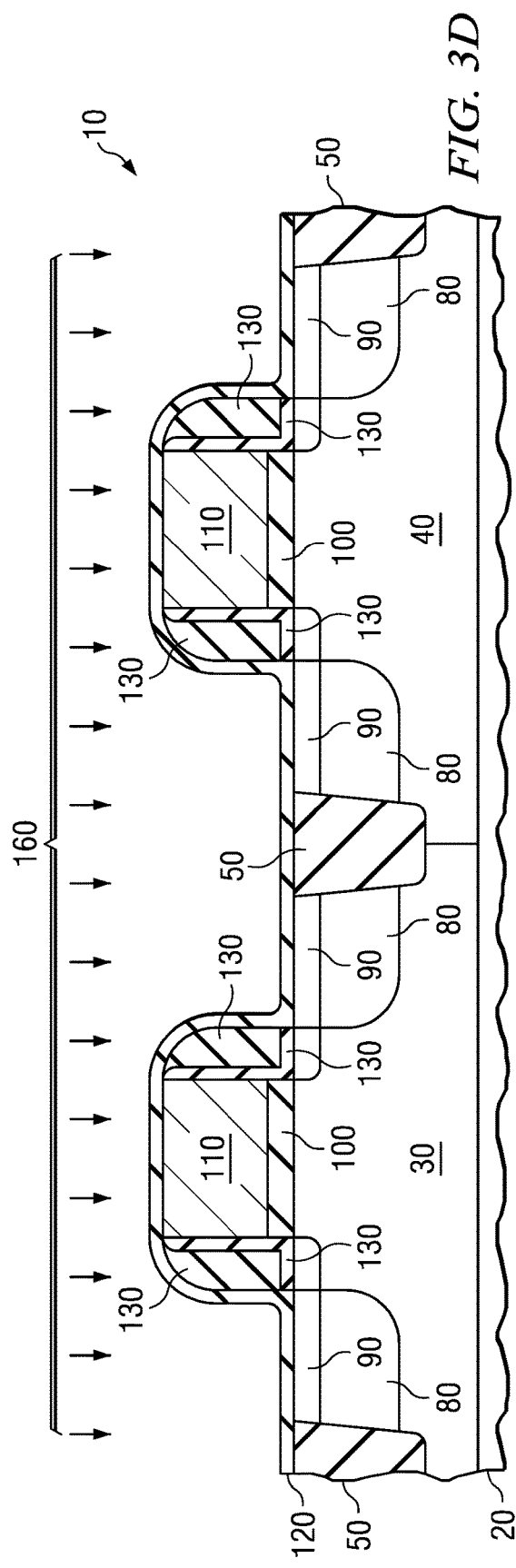

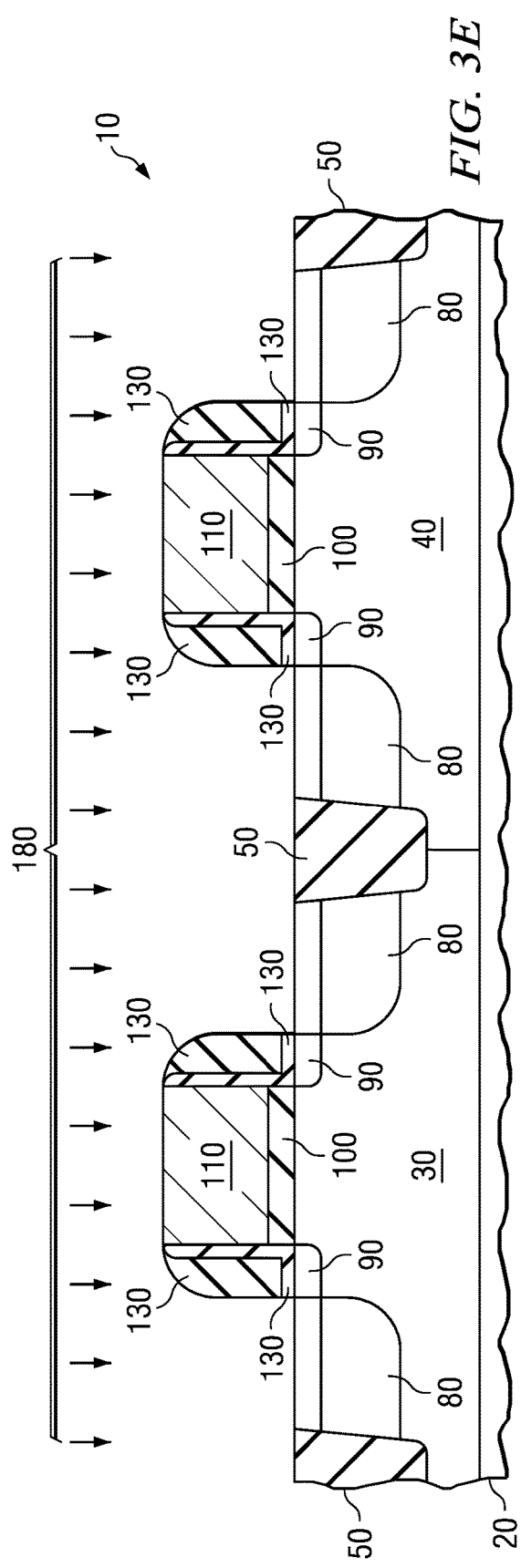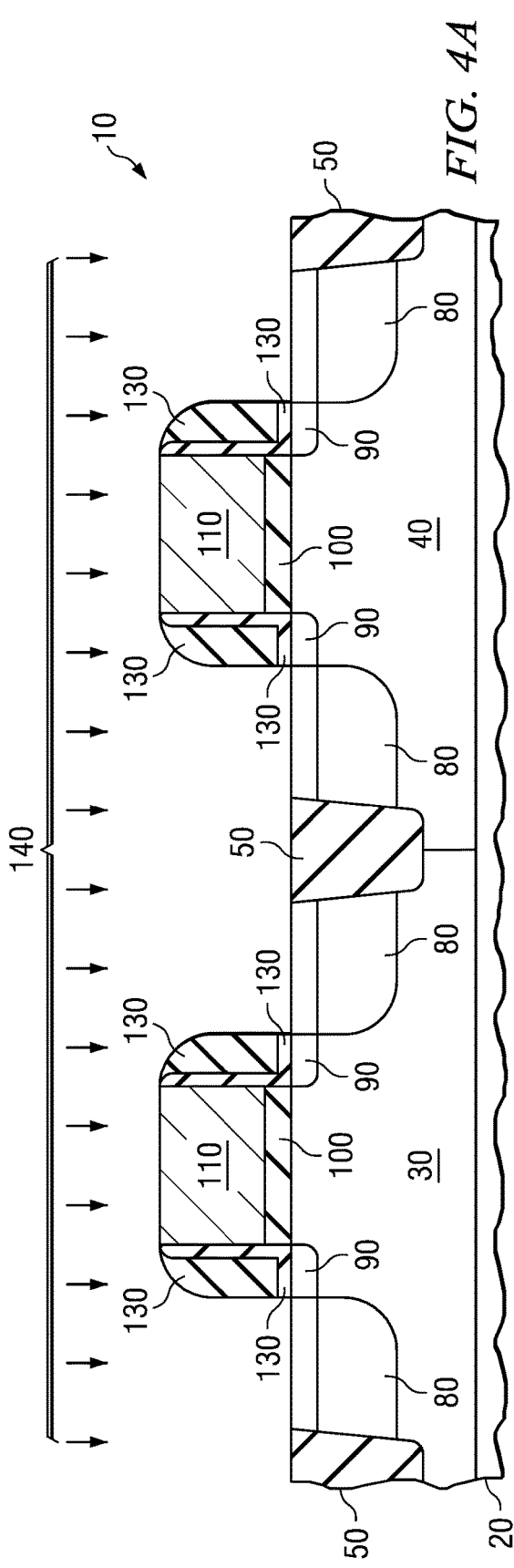

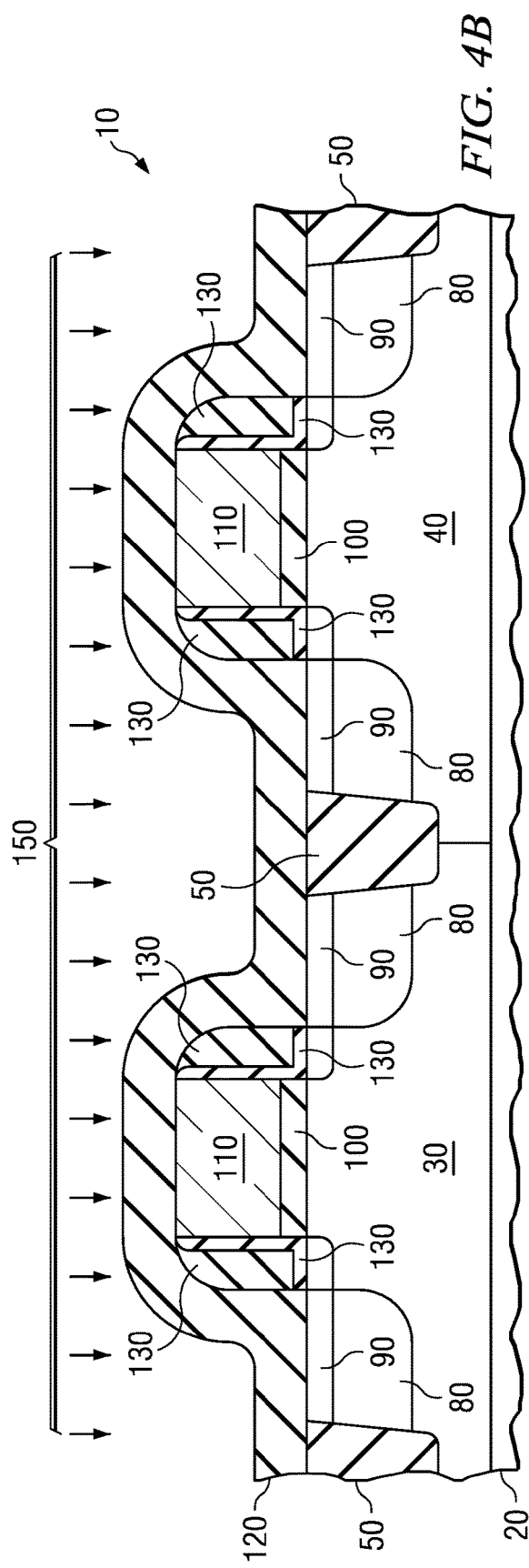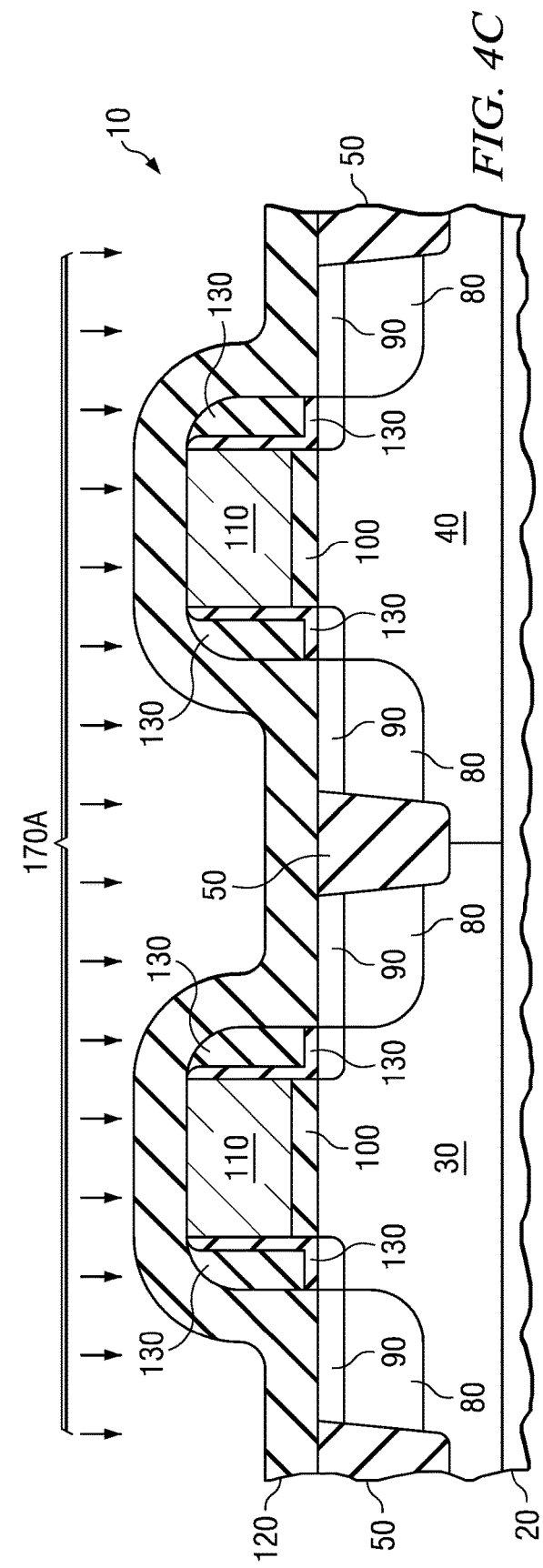

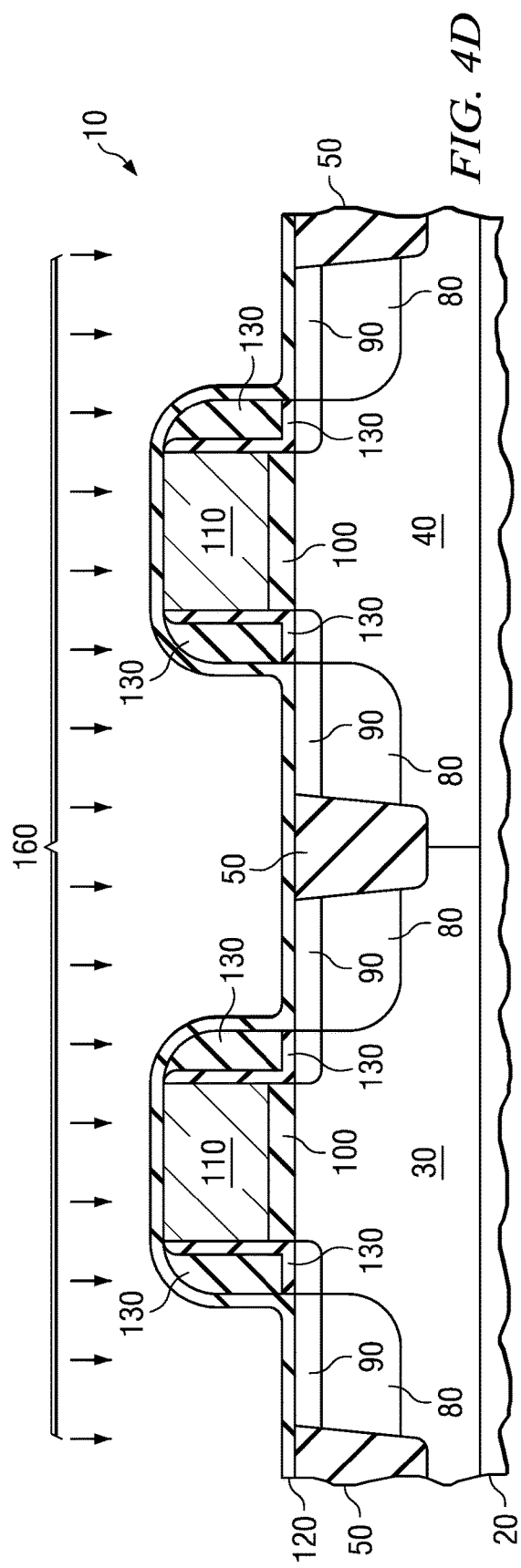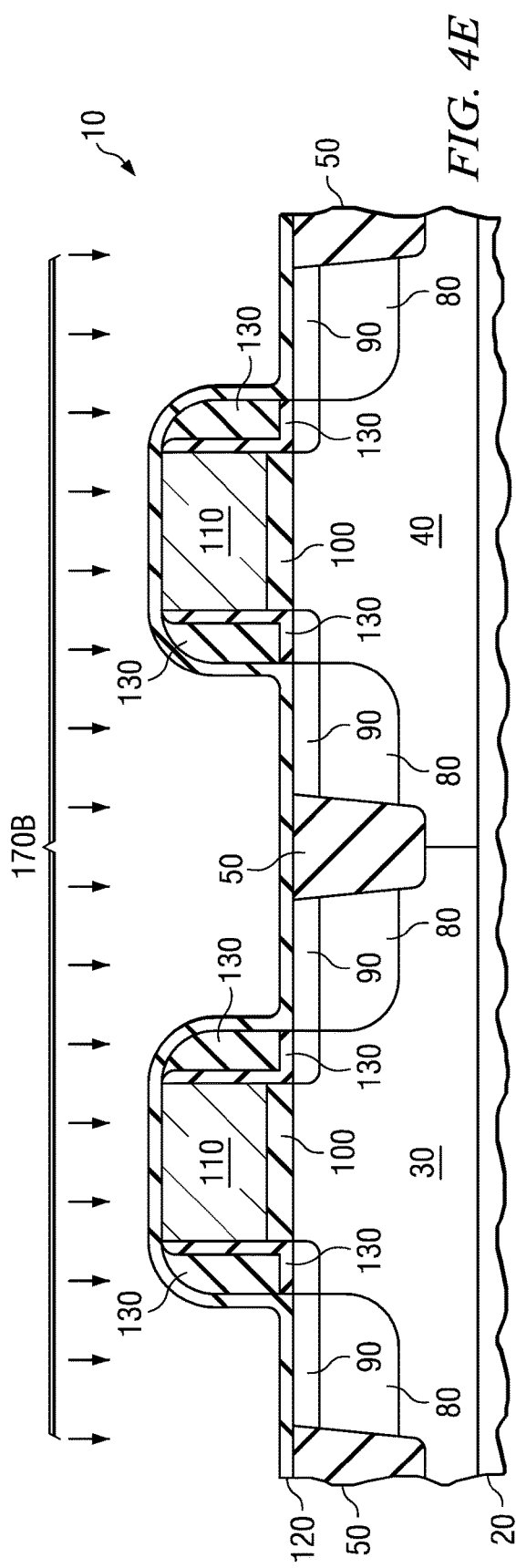

DAMAGE IMPLANTATION OF CAP LAYER

CROSS REFERENCE TO RELATED APPLICATIONS

This application is a continuation of U.S. application Ser. No. 15/674,266, filed Aug. 10, 2017, which is a division of and claims priority to U.S. application Ser. No. 12/817,829, filed on Jun. 17, 2017, now abandoned, which is a division of and claims priority to U.S. application Ser. No. 11/771,269, filed on Jun. 29, 2007, that is now U.S. Pat. No. 8,859,377, granted Oct. 14, 2014, the contents of all are incorporated herein by reference in their entirety.

BACKGROUND OF THE INVENTION

This invention relates to the fabrication of a semiconductor transistor using a cap layer during the source/drain anneal process.

BRIEF DESCRIPTION OF THE DRAWINGS

FIG. 1 is a cross-sectional view of a semiconductor structure in accordance with the present invention.

FIGS. 2A-2E are cross-sectional diagrams of a process for forming a transistor in accordance with the present invention.

FIGS. 3A-3E are cross-sectional diagrams of an alternative process for forming a transistor in accordance with an alternative embodiment of the present invention.

FIGS. 4A-4F are cross-sectional diagrams of another alternative process for forming a transistor in accordance with an alternative embodiment of the present invention.

DETAILED DESCRIPTION OF THE INVENTION

Figure 2B:
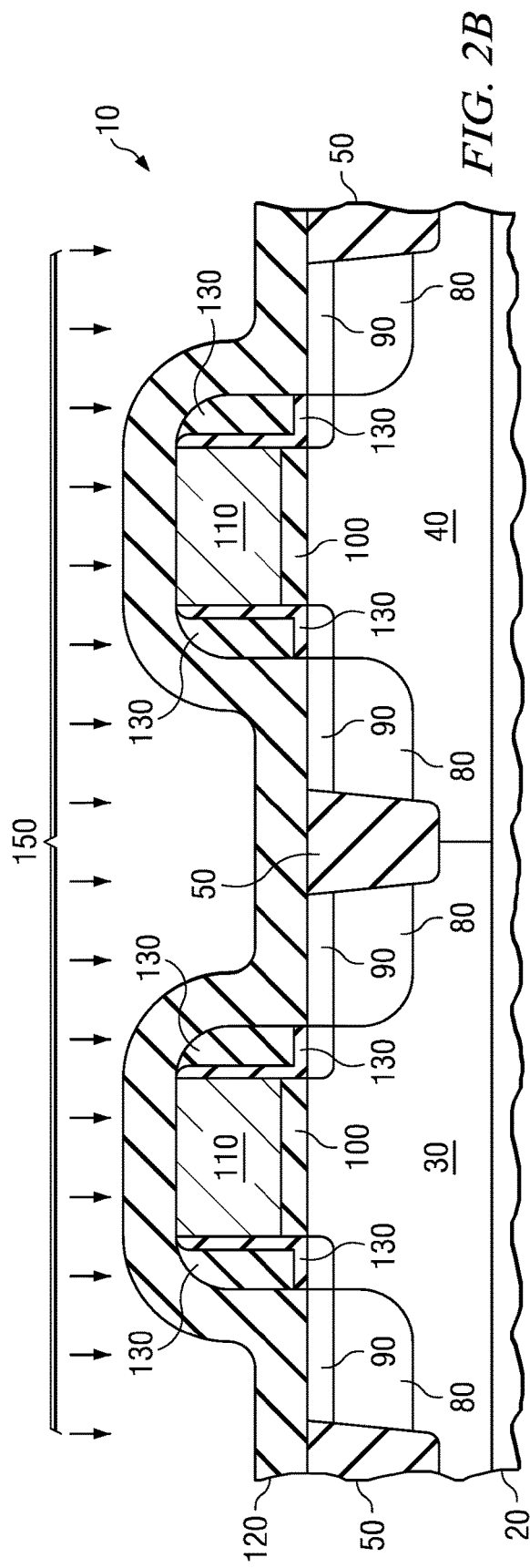

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a portion of a semiconductor wafer 10 in accordance with the present invention. In the example application, CMOS transistors 60, 70 are formed within a semiconductor substrate 20 having a p-well 30 containing the NMOS transistor 70 and an n-well 40 containing PMOS transistor 60. The portions of the semiconductor wafer 10 that are not shown may contain any combination of active and passive devices, such as additional CMOS, BiCMOS and bipolar junction transistors—as well as capacitors, optoelectronic devices, inductors, resistors, and diodes.

The CMOS transistors 60, 70 are electrically insulated from other active devices located within the semiconductor wafer 10 (not shown) by shallow trench isolation structures 50 formed within the semiconductor substrate 20; however, any conventional isolation structure may be used such as field oxide regions or implanted isolation regions. The semiconductor substrate 20 may be a single-crystalline substrate that is doped with n-type and p-type dopants; however, it may also be a silicon germanium ("SiGe") substrate, a silicon-on-insulator ("SOI") substrate, or a single-crystalline substrate having an epitaxial silicon layer that is doped with n-type and p-type dopants.

Transistors, such as CMOS transistors 60, 70, are generally comprised of a gate, source, and drain. More specifically, as shown in FIG. 1, the active portion of the CMOS transistors are comprised of source/drain regions 80, source/drain extension regions 90, a gate stack that is comprised of a gate dielectric 100 and gate electrode 110, and a channel region 190 located under the gate dielectric 100 and near the surface of the substrate.

The example PMOS transistor 60 is a p-channel MOS transistor. Therefore it is formed within an n-well region 40 of the semiconductor substrate 20. In addition, the deep source/drain regions 80 and the extension regions 90 have p-type dopants, such as boron. The extension regions 90 may be lightly doped ("LDD"), medium doped ("MDD"), or highly doped ("HDD"). However, sources/drain regions 80 are usually heavily doped. The PMOS gate stack is comprised of a p-type doped polysilicon electrode 110 and gate oxide dielectric 100. However, it is within the scope of the invention for the PMOS gate stack to have a metal electrode 110 instead of a polysilicon electrode 110.

The example NMOS transistor 70 is an n-channel MOS transistor. Therefore it is formed within a p-well region 30 of the semiconductor substrate 20. In addition, the deep sources and drains 80 and the source and drain extensions 90 have n-type dopants such as arsenic, phosphorous, antimony, or a combination of n-type dopants. The extension regions 90 may be LDD, MDD, or HDD. However, sources/drain regions 80 are usually heavily doped. The NMOS gate stack is comprised of an n-type doped polysilicon electrode 110 and gate oxide dielectric 100. However, it is within the scope of the invention for the NMOS gate stack to have a metal electrode 110 instead of a polysilicon electrode 110.

The extension regions 90 are formed using the gate stack 100, 110 as a mask in the example embodiment. However, it is within the scope of the invention to form the extension regions 90 using the gate stack plus extension sidewalls that are located proximate the gate stack (not shown) as a mask. An offset structure comprising source/drain sidewalls 130 is used during fabrication to enable the proper placement of the source/drain regions 80. More specifically, the sources/drain regions 80 are formed with the gate stack and source/drain sidewalls 130 as a mask.

In the example application shown in FIG. 1, a sacrificial conformal cap layer 120 (sometimes called a "stress memorization layer") covers the PMOS and NMOS transistors. The cap layer 120 is used during the fabrication process to impart (or "memorize") stress into the gate electrode 110 during the source/drain anneal process. In the On-state of the transistor, the stress that is memorized in the poly gate electrode 110 is transferred to the channel region 190, thereby improving transistor performance by improving the carrier mobility in the channel region (resulting in an improved transistor drive current without an increase in leakage current).

The cap layer 120 is preferably SiN; however, the cap layer 120 may be comprised of any suitable material such as SiON, SiC, SiOCN, or SiOC. In addition, the cap layer 120 is preferably 300-600 Å thick; however, the cap layer may be any suitable thickness between 50-1000 Å. The cap layer 120 in the example application is formed by a plasma enhanced chemical vapor deposition ("PECVD") process (using silane and ammonia precursors); however, the cap layer 120 may be formed with any suitable process such as chemical vapor deposition ("CVD") or low pressure chemical vapor deposition ("LPCVD").

The cap layer 120 in the example application may be implanted with an electrically neutral species such as Ar. However, the cap layer 120 may be implanted with other electrically neutral species such as Ge, As, and Sb. Moreover, it is within the scope of the invention for the cap layer to be implanted with any dopant that causes structural damage to the cap layer 120 but is un-reactive with the silicon substrate 20, such as Ar. The sacrificial cap layer 120 is implanted with one or more of these additional dopants to facilitate an improved etch rate when the cap layer is removed, as described infra.

Referring again to the drawings, FIGS. 2A-2E are cross-sectional views of a partially fabricated semiconductor wafer 10 illustrating a process for forming an example PMOS transistor 60 and NMOS transistor 70 in accordance with the present invention. The following example application is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

FIG. 2A is a cross-sectional view of a semiconductor substrate 20 containing partial PMOS and NMOS transistors 60, 70 that are formed with any standard manufacturing process. For example, a gate oxide layer and a gate polysilicon layer are initially formed over a semiconductor substrate 20 containing shallow trench isolation structures 50. Then, the gate oxide layer and the gate polysilicon layer are etched (using a patterned photoresist mask) to form the gate stacks of the PMOS and NMOS transistors 60, 70.

The extension regions 90 may be formed by low-energy ion implantation, gas phase diffusion, or solid phase diffusion. The dopants used to create the extension regions 90 for a PMOS transistor are p-type (i.e. boron). The dopants used to create the extension regions 90 for an NMOS transistor 70 are n-type (i.e. phosphorous and arsenic). In the example application, the gate stack 100, 110 is used as the mask to direct the placement of the extension regions 90; however, extension sidewalls may be formed proximate the gate stack 100, 110 and then used as a mask to direct the placement of the extension regions 90.

Next, source/drain sidewalls 130 are formed proximate to the gate stack 100, 110. The example source/drain sidewalls 130 are comprised of a layer of nitride and a cap oxide; however, it is within the scope of the invention to use more layers (i.e. an L-shaped cap oxide layer, an L-shaped nitride layer, and a final oxide layer) or less layers (just a silicon oxide layer or just a silicon nitride layer) to create the source/drain sidewalls 130. The gate stack 100, 110 and the source/drain sidewalls 110 are used as a template for the source/drain implant 140 of dopants to form the source/drain regions 80. The source/drain regions 80 may be formed by any standard implantation process, such as deep ion implantation or deep diffusion. The dopants used to create the source/drain regions 80 for a PMOS transistor are typically boron; however, other dopants or combinations for dopants may be used. The dopants used to create the source/drain regions 80 for an NMOS transistor are typically phosphorous and arsenic; however, other dopants or combinations for dopants may be used.

In accordance with the example embodiment, a sacrificial cap layer 120 is now formed over the semiconductor wafer 10, as shown in FIG. 2B. The cap layer 120 is preferably SiN; however, the cap layer 120 may be comprised of any suitable material such as SiON, SiC, SiOCN, or SiOC. The SiN cap layer 120 may have a thickness between 200-1000 Å and the thickness is preferably between 300-600 Å.

The cap layer 120 may be formed by any suitable process such as plasma enhanced chemical vapor deposition ("PECVD") using any suitable machine such as the Centura (sold by AMAT). In the example application, the PECVD process 150 uses silane and ammonia precursors, a pressure of 1-30 Torr, a power level between 50-300 W, and a substrate temperature of 250-450° C. Alternatively, the cap layer 120 may be formed using another standard process, such as CVD or LPCVD (including BTBAS).

Figure 2C:
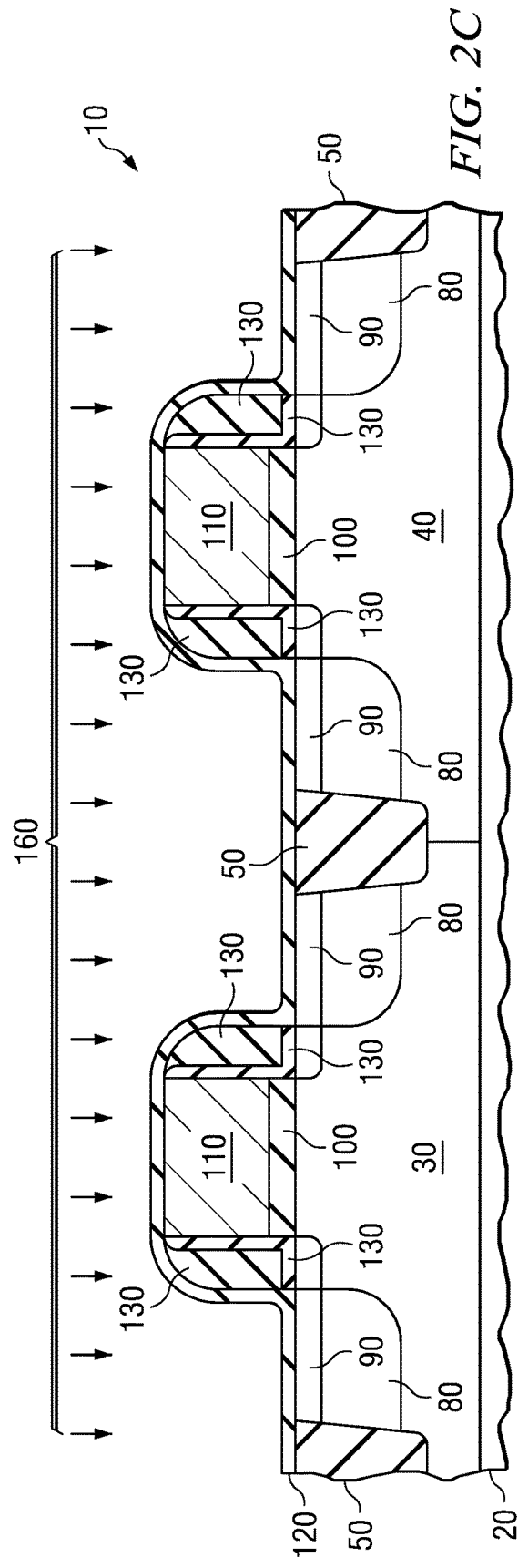

The next step in the fabrication process is a standard source/drain anneal 160, as shown in FIG. 2C. In the example application, the source/drain regions 80 plus the extension regions 90 are activated by the anneal step 160. This anneal step activates the dopants and repairs the damage to the semiconductor wafer caused by the ion implants. The activation anneal may be performed by any conventional technique such as rapid thermal annealing ("RTA") or spike annealing. However, the anneal 160 is preferably performed by a millisecond anneal process such as flash lamp annealing ("FLA") or laser annealing. Moreover, it is within the scope of the invention to use a combination of conventional and millisecond anneals for step 160.

The anneal step 160 causes lateral and vertical migration of dopants in the sources/drain regions 80 and the extension regions 90. In addition, the anneal step causes the full crystallization of the ion implant areas 80, 90. If needed, a second anneal (which is generally similar to the first anneal), or multiple conventional and millisecond anneals, may be performed to promote recrystallization and further lateral dopant movement of the ion implant areas 80, 90.

The anneal 160 also causes the cap layer 120 to change stoichiometrically (by physically restructuring of the bonds of the cap layer 120). For the SiN cap layer 120 of the example application, hydrogen is released in the anneal process—causing the atomic percent of nitrogen and the atomic percent of silicon to increase. The result is that the cap layer 120 will have an increased density (and a reduced thickness). Therefore, the compositional changes of the cap layer 120 that occur during the anneal process causes the cap layer 120 to densify and transfer its stresses to the gate electrode 110.

The change in structure of the cap layer 120 (resulting from the source/drain anneal 160) generally reduces the etch rate of the cap layer 120. As a result, it is sometimes difficult to thoroughly remove the cap layer 120 using standard wafer cleaning processes. Therefore, in accordance with the example embodiment, the semiconductor wafer 10 is subjected to a blanket damage implant process 170 using a standard high current implanter (sold by AMAT or Varian), as shown in FIG. 2D.

The damage implant 170 causes the cap layer 120 to be damaged, thereby increasing the etch rate of the cap layer 120. In the example application, the cap layer 120 is implanted with an inert and electrically neutral species such as Ar. However, it is within the scope of the invention to implant other electrically neutral species such as Ge, As, or Sb. It is also within the scope of the invention to implant a combination of species. Moreover, it is within the scope of the invention to implant any species that will cause structural damage to the cap layer 120 (and is preferably unreactive with the silicon substrate 20).

Once the damage implant 170 is complete, the cap layer 120 is removed, as shown in FIG. 2E. In the example fabrication process, the cap layer 120 is removed with a standard etch 180 such as a wet etch using hot phosphoric acid clean ($H_3PO_4$). However, other standard cleaning processes may be used, such as a plasma dry etch (using a mixture of $Cl_2/HBr/He/O_2$). It is to be noted that the damage implant 170 caused the etch rate of the cap layer 120 to be increased; therefore, it is easier to remove the cap layer 120 with the standard clean process 180. Moreover, the damage implant 170 may ensure that the standard clean process 180 thoroughly removes the cap layer 120.

The fabrication of the semiconductor wafer 10 now continues with standard process steps until the semiconductor device is complete. Generally, the next step is the silicidation of the source/drain regions 80 and gate electrode 110, the formation of the dielectric insulator layer, and then the formation of the contacts within the transistor layer of the integrated circuit. The semiconductor wafer fabrication continues with the completion of the back-end structure that contains the metal interconnects for electrically connecting the PMOS transistor 60 and the NMOS transistor 70 to the remainder of the integrated circuit. Once the fabrication process is complete, the integrated circuit will be tested and then packaged.

Figure 3A:
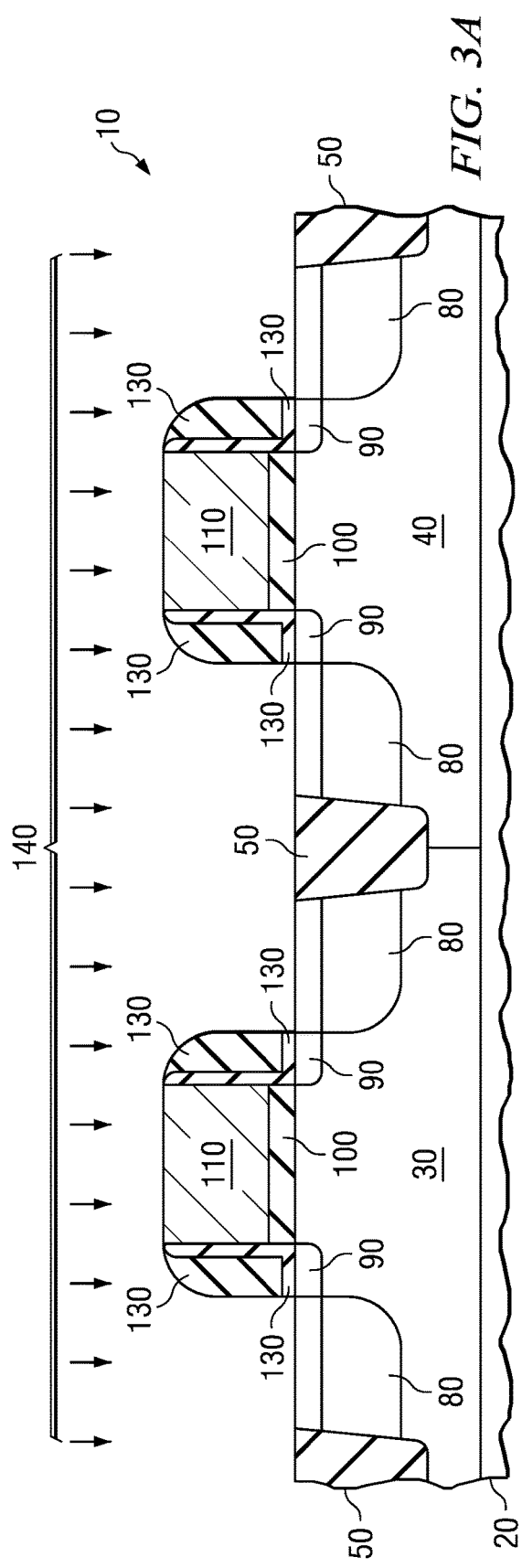
Figure 3B:
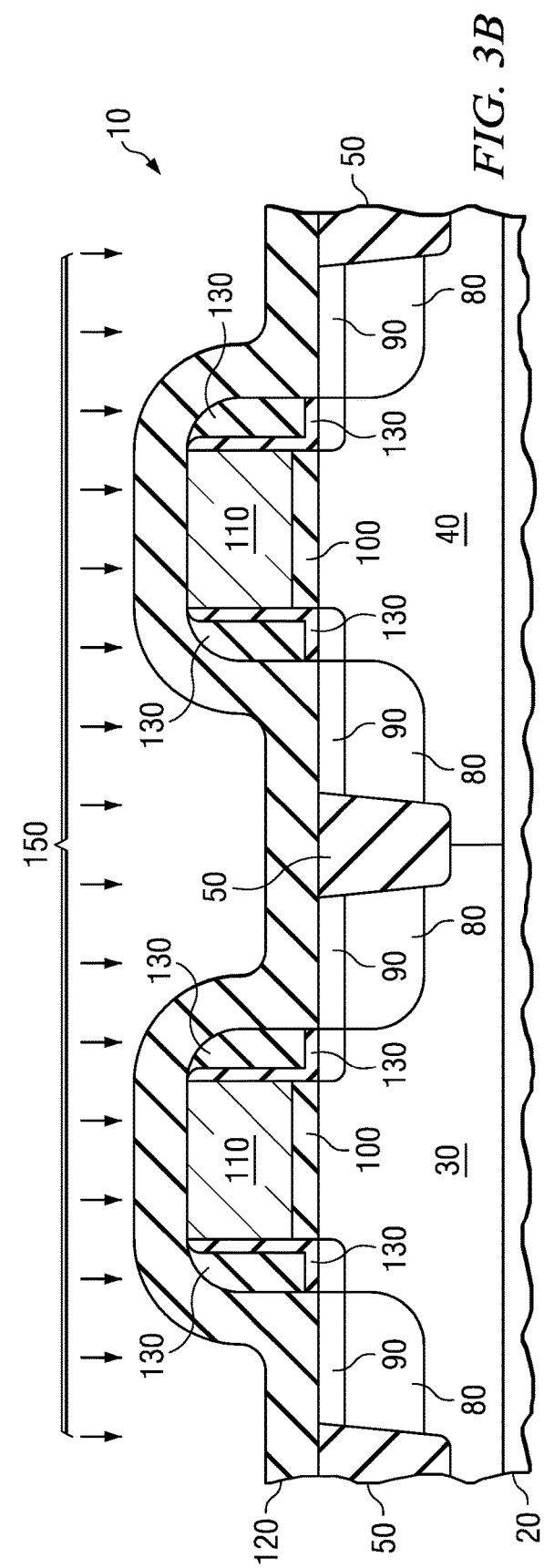

FIGS. 3A-3E are cross-sectional views of a first alternative process for forming an example PMOS transistor 60 and NMOS transistor 70 in accordance with the present invention. Specifically, the structures shown in FIGS. 3A-3B are similar to the structures shown in FIGS. 2A-2B. The source/drain implant (140) is performed in FIG. 3A and the cap layer 120 is formed (150) in FIG. 3B. However, in the first alternative embodiment, the damage implant 170 is performed before the source/drain anneal (160), as shown in FIG. 3C. The damage implant 170 may be similar to the damage implant 170 described supra. Therefore, the dopant is preferably Ar, but any inert or electrically neutral dopant may be used. However, in the example alternative application, the implant dosage is increased (in order to obtain the targeted damage to the cap layer 120) because some of the dopants will be released (thereby reversing some of the damage to the cap layer 120) during the subsequent source/drain anneal 160 (of FIG. 3D).

As shown in FIG. 3D, the source/drain anneal 160 is performed upon completion of the damage implant 170. The source/drain anneal 160 is similar to the source/drain anneal 160 described supra; therefore, the cap layer 120 will change composition, becoming densified and reduced in thickness.

In the first alternative fabrication process shown in FIG. 3E, the cap layer 120 is removed after the source/drain anneal 160 with a standard etch 180 such as a wet etch using hot phosphoric acid clean ($H_3PO_4$). However, other standard cleaning processes may be used, such as a plasma dry etch (using a mixture of $Cl_2/HBr/He/O_2$). It is to be noted that the damage implant 170 (performed before the source/drain anneal 160) caused the etch rate of the cap layer 120 to be increased; therefore, it is easier to remove the cap layer 120 with a standard clean process 180. In addition, the damage implant 170 may ensure that the standard clean process 180 will thoroughly remove the cap layer 120.

Figure 4F:
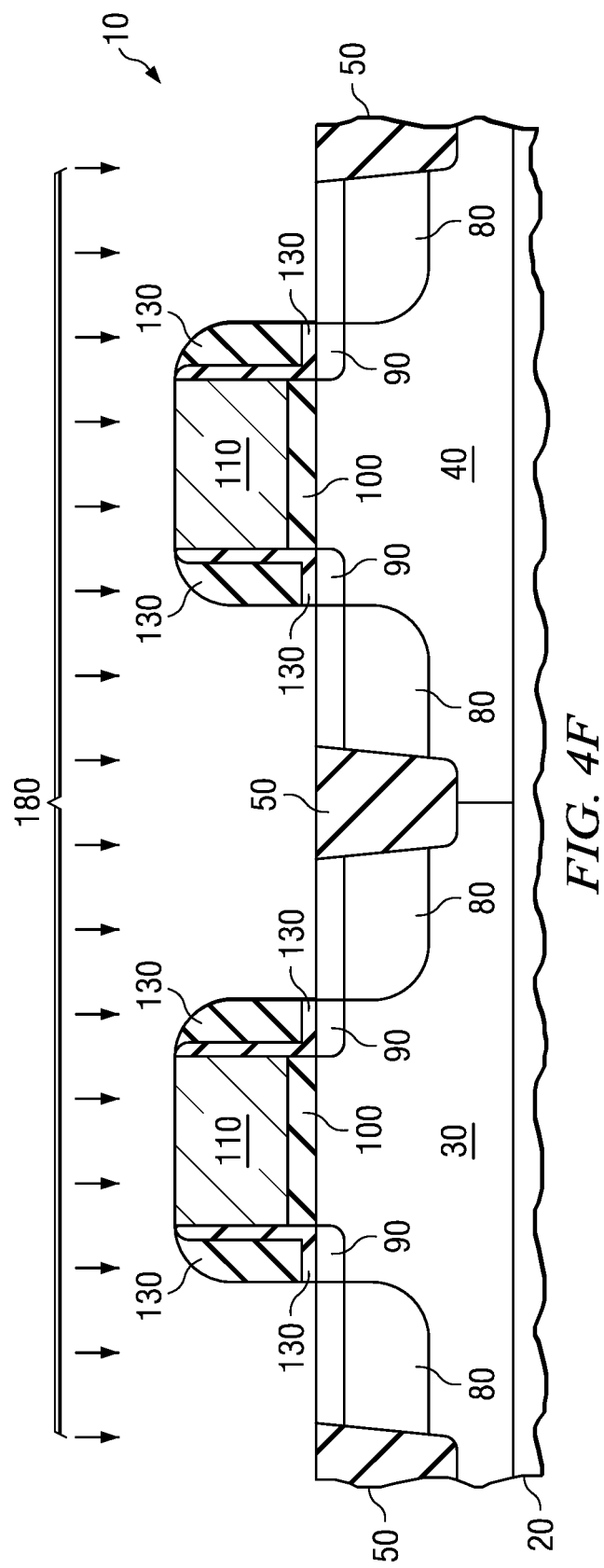

FIGS. 4A-4F are cross-sectional views of a second alternative process for forming an example PMOS transistor 60 and NMOS transistor 70 in accordance with the present invention. The structures shown in FIGS. 4A-4D are similar to the structures shown in FIGS. 3A-3D. The source/drain implant (140) is performed in FIG. 4A and the cap layer 120 is formed (150) in FIG. 4B. As shown in FIG. 4C, a first damage implant 170A is performed before the source/drain anneal (160). The first damage implant 170A may be similar to the damage implants 170 described supra. Therefore, the dopant is preferably Ar, but any inert or electrically neutral dopant may be used. However, in the example alternative application, the implant dosage is reduced (in order to ultimately obtain the targeted damage to the cap layer 120) because additional dopants will be implanted during a second damage implant 170B (as described infra).

Upon completion of the damage implant, the source/drain anneal 160 is performed, as shown in FIG. 4D. The source/drain anneal 160 is similar to the source/drain anneals 160 described supra; therefore, the cap layer 120 will change composition—becoming densified and having a reduced thickness.

In the second alternative fabrication process shown in FIG. 4E, a second damage implant 170B is performed after the source/drain anneal 160. The second damage implant 170B may be similar to the damage implants 170 described supra. Therefore, the dopant is preferably Ar, but any inert or electrically neutral dopant may be used. However, it is within the scope of the invention to use a different dopant for the second damage implant 170B than was used for the first damage implant 170A. In the example alternative application, the dosage of the second damage implant 170B is the remaining dosage needed to obtain the targeted damage to the cap layer 120. In addition, the implant energy for the second damage implant 170B of the example application is increased in order to facilitate the implantation of dopants into the densified cap layer 120. The implant energies and doses for both implants are optimized to ensure adequate damage to the cap layer and facilitate its easy removal in subsequent cleaning steps. It is to be noted that it may be desirable to use a heavier dopant (such as Sb) for the second damage implant 170B in order to better penetrate the denser cap layer 120 created by the first damage implant 170A.

The cap layer 120 is removed after the second damage implant 170B with a standard etch 180 such as a wet etch using hot phosphoric acid clean ($H_3PO_4$), as shown in FIG. 4F. However, other standard cleaning processes may be used, such as a plasma dry etch (using a mixture of $Cl_2/HBr/He/O_2$). It is to be noted that the damage implants 170A and 170B (performed before and after the source/drain anneal 160) caused the etch rate of the cap layer 120 to be increased; therefore, it is easier to remove the cap layer 120 with a standard clean process 180. In addition, the damage implants 170A and 170B may ensure that the cap layer 120 is thoroughly removed with the standard clean process 180.

Various additional modifications to the invention as described above are within the scope of the claimed invention. As an example, the invention may be used during the fabrication of BiCMOS transistors, diodes, or poly block resistors. Moreover, the cap layer 120 may contain additional layers such as a silicon oxide liner film that is formed before the SiN layer (to possibly enhance the transistor drive current).

Interfacial layers may be formed between any of the layers shown. In addition, an anneal process may be performed after any step in the above-described fabrication process. For example, an anneal process may be performed after the implantation of the extension regions 90 but before the implantation of the source/drain regions 80. When used, the anneal process can improve the microstructure of materials and thereby improve the quality of the semiconductor structure.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating an integrated circuit, comprising:
   performing a source/drain implant of a semiconductor wafer, the semiconductor wafer including a partial transistor including a gate stack, source/drain extension regions, and source/drain sidewalls;
   forming a sacrificial layer over the semiconductor wafer after performing the source/drain implant;
   performing a source/drain anneal of the semiconductor wafer; and
   implanting the sacrificial layer with an electrically neutral species after performing the source/drain anneal, wherein the sacrificial layer is structurally damaged as a result of implanting the electrically neutral species.

2. The method of claim 1, wherein the source/drain anneal is a millisecond anneal process.

3. The method of claim 1, wherein the electrically neutral species comprises Ar.

4. The method of claim 1, further comprising removing the sacrificial layer using a hot phosphoric acid.

5. The method of claim 1, wherein the sacrificial layer has a thickness between 200-1000 Å.

6. The method of claim 1, wherein the partial transistor is a partial NMOS transistor and the sacrificial layer is additionally formed over a PMOS transistor.

7. The method of claim 1, wherein the partial transistor is a partial PMOS transistor and the sacrificial layer is additionally formed over a NMOS transistor.

8. A method for fabricating a transistor on a semiconductor wafer, comprising:
   performing a source/drain implant of the semiconductor wafer, the semiconductor wafer including a partial transistor including a gate stack, source/drain extension regions, and source/drain sidewalls;
   forming a sacrificial layer over the semiconductor wafer after performing the source/drain implant;
   implanting the sacrificial layer with an electrically neutral species, wherein the sacrificial layer is structurally damaged as a result of implanting the electrically neutral species; and
   performing a source/drain anneal after implanting the sacrificial layer.

9. The method of claim 8, wherein the source/drain anneal is a millisecond anneal process.

10. The method of claim 8, wherein the electrically neutral species comprises Ar.

11. The method of claim 8, further comprising removing the sacrificial layer using a hot phosphoric acid.

12. The method of claim 8, wherein the sacrificial layer has a thickness between 200-1000 Å.

13. The method of claim 8, wherein the partial transistor is a partial NMOS transistor and the sacrificial layer is additionally formed over a PMOS transistor.

14. The method of claim 8, wherein the partial transistor is a partial PMOS transistor and the sacrificial layer is additionally formed over a NMOS transistor.

15. A method, comprising:
   performing a source/drain implant to a semiconductor substrate, the semiconductor substrate including a partial transistor with a gate stack, source/drain extension regions, and source/drain sidewalls;
   forming a sacrificial layer over the semiconductor substrate after performing the source/drain implant;
   performing a source/drain anneal of the semiconductor substrate; and
   implanting the sacrificial layer with an electrically neutral species after performing the source/drain anneal, wherein the sacrificial layer is structurally damaged as a result of implanting the electrically neutral species.

16. The method of claim 15, wherein the partial transistor is a partial PMOS transistor or a partial NMOS transistor.

17. The method of claim 15, wherein the sacrificial layer includes SiN, SiON, SiC, SiOCN, or SiOC.

18. The method of claim 15, wherein an etch rate of the sacrificial layer is increased as a result of implanting the sacrificial layer with the electrically neutral species.

19. The method of claim 15, further comprising:
   removing the sacrificial layer over the semiconductor substrate after implanting the sacrificial layer with the electrically neutral species.

20. The method of claim 15, wherein the electrically neutral species is a second electrically neutral species, the method further comprising:
   implanting the sacrificial layer with a first electrically neutral species, prior to performing the source/drain anneal.

21. The method of claim 20, wherein:
   the first electrically neutral species includes argon (Ar); and
   the second electrically neutral species includes antimony (Sb).

22. The method of claim 20, wherein:
   implanting the first electrically neutral species is carried out with a first dose of the first electrically neutral species; and
   implanting the second electrically neutral species is carried out with a second dose of the second electrically neutral species, wherein a sum of the first dose and the second dose is based on a targeted total damage to the sacrificial layer.

23. The method of claim 20, wherein:
   implanting the first electrically neutral species is carried out with a first implant energy; and
   implanting the second electrically neutral species carried out with a second implant energy greater than the first implant energy.

* * * * *